United States Patent [19]

Diller et al.

[11] Patent Number: 4,743,845

[45] Date of Patent: May 10, 1988

[54] OSCILLOSCOPE-BASED SIGNAL LEVEL MEASUREMENT SYSTEM

[75] Inventors: Calvin D. Diller, Hillsboro; Douglas C. Stevens, Portland, both of Oreg.

[73] Assignee: Tektronix, Inc., Beaverton, Oreg.

[21] Appl. No.: 908,551

[22] Filed: Sep. 17, 1986

[51] Int. Cl.⁴ ............................................. G01R 13/20
[52] U.S. Cl. .............................. 324/121 R; 324/77 A; 364/487
[58] Field of Search ....................... 324/121 R, 77 A; 364/487; 315/377; 340/720, 723, 728

[56] References Cited

U.S. PATENT DOCUMENTS

| | | | |
|---|---|---|---|
| 2,539,971 | 1/1951 | Potjer | 324/121 R |
| 2,843,824 | 7/1958 | Whittier | 324/121 R |
| 4,476,432 | 10/1984 | Olson | 324/77 A |
| 4,536,707 | 8/1985 | Herweg | 324/121 R |

*Primary Examiner*—Ernest F. Karlsen
*Attorney, Agent, or Firm*—John P. Dellett; Daniel J. Bedell; George T. Noe

[57] ABSTRACT

In an oscilloscope, a readout control circuit is adapted to create a horizontal cursor on an oscilloscope screen at a vertical level controlled by cursor level data generated by a microcomputer, and to cause the beam to form characters on the screen indicating a voltage represented by the vertical level of the cursor. Vertical offset and vertical gain parameters characterizing a vertical preamplifier system controlling display of a waveform are measured and utilized to determine the value of cursor level data needed to cause the readout control circuit to position the cursor on the screen to accurately reflect a selected voltage with respect to voltage magnitudes represented by points on the displayed waveform. The oscilloscope is adapted to measure peak magnitudes of a vertical preamplifier input signal, and the readout control circuit permits the oscilloscope to display a cursor on a screen at a level indicating the magnitude of the measured peak with respect to magnitudes represented by a displayed waveform.

10 Claims, 5 Drawing Sheets

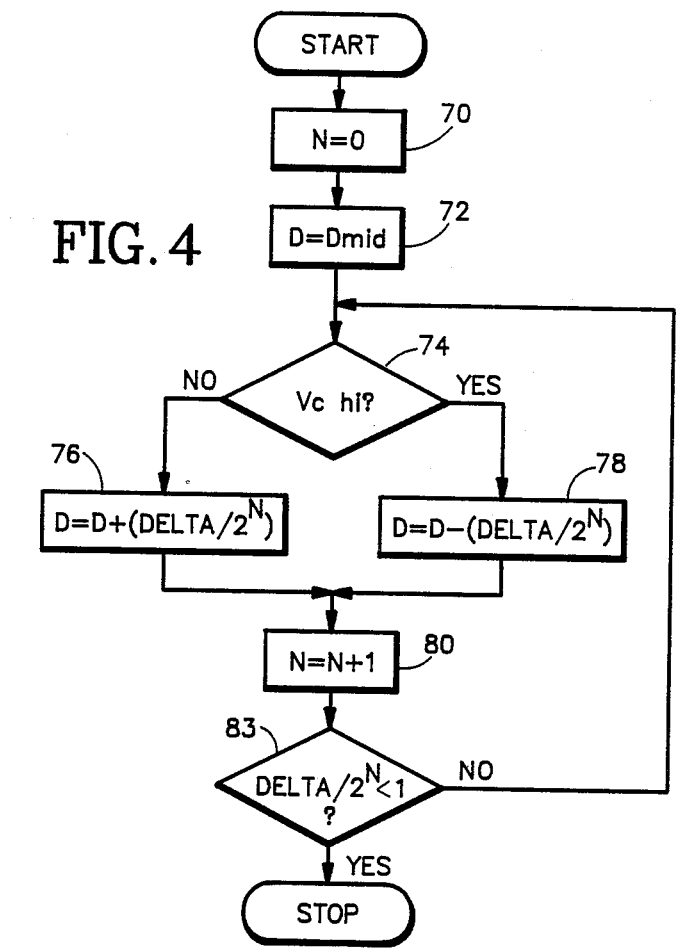
FIG. 4
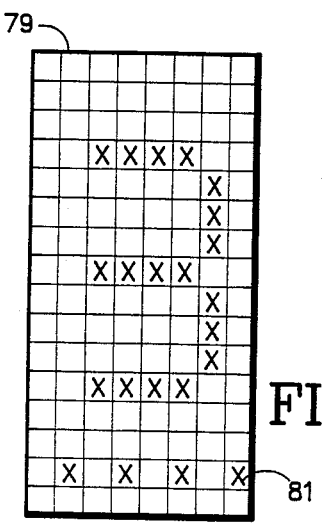
FIG. 5
FIG. 6

OSCILLOSCOPE-BASED SIGNAL LEVEL MEASUREMENT SYSTEM

BACKGROUND OF THE INVENTION

The present invention relates in general to oscilloscopes and in particular to a system for determining input signal magnitudes represented by points on a waveform displayed on an oscilloscope screen.

Oscilloscopes typically display a waveform representing an input signal on a screen, the waveform comprising a graph of input signal magnitude as a function of time. The graph is created by an electron beam moving across the screen, the vertical position of the beam being controlled by the input signal and the horizontal positoin of the beam being controlled by a voltage ramp (sweep) signal. A grid having vertical and horizontal lines is often superimposed on the screen to permit an operator to gauge vertical and horizontal displacement of any selected point on the waveform from a reference point on the grid. Given the relationship between vertical grid divisions and voltage magnitude (the vertical gain of the oscilloscope in volts/grid division) and the relationship between horizontal grid divisions and time (the sweep speed of the beam in grid divisions/second), the operator can determine the relative magnitude or timing of the selected point along the waveform with respect to the reference point by measuring the vertical or horizontal displacement of the selected point in grid divisions and multiplying by the vertical gain or sweep rate. Oscilloscope operators may be interested, for example, in determining the peak values of periodic signals, but sometimes find it difficult to see the signal peak, particularly when the input signal contains high frequency components which are of such short duration that they are only faintly visible on the screen, or not visible at all. Even when the peak can be observed, an operator normally cannot gauge the vertical position of the peak within the grid with high accuracy.

In addition, "vertical" amplifier systems in an oscilloscope, which amplify the input signal in order to produce a signal for controlling the vertical position of the beam, exhibit gain and offset errors which vary with oscilloscope operating temperature, component aging and other factors. These gain and offset errors cause the actual vertical gain of the oscilloscope to differ from its nominal value and cause the actual location of a reference point on the grid to vary from its nominal, expected location. Therefore the product of the nominal gain and the vertical displacement of a selected waveform point from the nominal reference point location does not accurately reflect the actual magnitude represented by the waveform point.

What is needed is a system for accurately determining signal magnitudes represented by points on waveforms displayed on an oscilloscope screen, and for communicating the measured magnitudes to an oscilloscope operator.

SUMMARY OF THE INVENTION

In an oscilloscope, the vertical position of an electron beam on a cathode ray tube screen is controlled by a signal produced by a vertical preamplifier/amplifier combination and the horizontal position of the electron beam is controlled by a sweep signal produced by a sweep generator in response to a sweep gate signal which may be produced by a trigger system. The intensity of the beam is controlled by a signal produced by a "Z-axis" amplifier in proportion to a waveform Z-axis control signal. The trigger system suitably includes a trigger comparator for comparing a trigger source signal output of the vertical preamplifier to a trigger level output of a digital-to-analog converter (DAC) and for producing a trigger signal when the trigger source signal rises above (or alternatively falls below) the trigger level. In one embodiment, the trigger signal is applied to a gate generator which produces the sweep gate signal in response thereto. The trigger source signal magnitude is proportional to the magnitude of the vertical preamplifier input signal and therefore the sweep signal may be initiated according to when the vertical preamplifier input signal reaches any desired level.

In accordance with one aspect of the invention, vertical, horizontal, and Z-axis control signals produced by a "readout control" circuit are respectively multiplexed with the output signal of the vertical preamplifier, the sweep signal, and the waveform Z-axis control signal so that the readout control circuit may control the vertical and horizontal position and the intensity of the electron beam. The readout control circuit is adapted to cause the beam to produce a cursor on the screen at a vertical level controlled by cursor level data input generated by means of a microcomputer within the oscilloscope. The readout control circuit is also adapted to cause the beam to form characters on the screen above the cursor indicating a voltage represented by the vertical level of the cursor. Vertical offset and vertical gain parameters characterizing the vertical preamplifier of the oscilloscope are determined experimentally and utilized by the microcomputer to determine the value of cursor level data needed to cause the readout circuit to produce an output signal which will vertically position the cursor on the screen and to set the magnitude data to accurately indicate any desired voltage level of the displayed waveform.

In accordance with another aspect of the invention, a control knob is mounted on the front panel of the oscilloscope, and knob interface circuitry provides the microcomputer with data indicating the extent and direction of knob rotation. In one mode of operation the microcomputer is adapted to adjust the cursor level data in proportion to the amount and direction of knob rotation, thereby permitting an operator to vertically position the cursor to any desired level and to determine the magnitude associated with that level by reading the magnitude data displayed above the cursor. Thus the operator may determine the magnitude represented by any point on a displayed waveform by positioning the cursor to that point. Since the magnitude data displayed is computed based on the actual, rather than the nominal, vertical gain and offset of the vertical preamplifier, the effects of gain and offset error in the vertical preamplifier on the measured waveform magnitude are eliminated.

In accordance with a further aspect of the invention, the oscilloscope is adapted to measure the maximum (or minimum) peak magnitude, the RMS value, or the DC level of a vertical preamplifier input signal in terms of the magnitude of input data which must be supplied to a trigger level DAC in order to cause the trigger level DAC to produce a trigger level output substantially matching a peak, RMS or DC level of the trigger source signal produced by the vertical preamplifier in response to the input signal. Trigger offset and gain parameters characterizing the response of the vertical preamplifier are also determined experimentally. The trigger offset parameter represents the value of trigger level DAC input data which would cause it to produce a trigger level substantially matching the trigger source signal when the vertical preamplifier input is grounded. The trigger gain parameter represents the change in trigger level DAC input data which would cause the trigger level to increase by the same amount that the trigger source signal would increase when the magnitude of the vertical preamplifier input signal is increased by a predetermined amount. The trigger offset and gain parameters are utilized to convert measurements of vertical preamplifier input signal peak, RMS or DC levels, expressed in terms of trigger level DAC input data, to voltages.

In accordance with still another aspect of the invention, the microcomputer utilizes an input signal level measurement, and the measured vertical preamplifier offset and gain parameters characterizing the vertical input channel, to determine the value of cursor level data supplied to the readout control circuit so that the cursor may be displayed at a vertical level corresponding to a measured peak, RMS or DC level of the vertical preamplifier input signal, and so that characters indicating the measured input signal level may also be displayed above the cursor.

It is accordingly an object of the invention to display a cursor on an oscilloscope screen at a vertical level representing a predetermined voltage on a displayed waveform.

It is another object of the invention to provide an improved system for displaying data on an oscilloscope screen accurately indicating the magnitude represented by a selected point on a displayed waveform.

It is a further object of the invention to provide an improved system for measuring levels of an oscilloscope input signal and for displaying a cursor on the oscilloscope screen at a position representing the measured level of the input signal.

The subject matter of the present invention is particularly pointed out and distinctly claimed in the concluding portion of this specification. However, both the organization and method of operation of the invention, together with further advantages and objects thereof, will best be understood by reference to the following description taken in connection with accompanying drawings.

DRAWINGS

FIG. 4 is a flow chart for programming the microcomputer of the oscilloscope of FIG. 1;

FIGS. 5 and 6 are examples of characters utilized to create a cursor and cursor magnitude display on the screen of FIG. 2;

DETAILED DESCRIPTION

Figure 1:
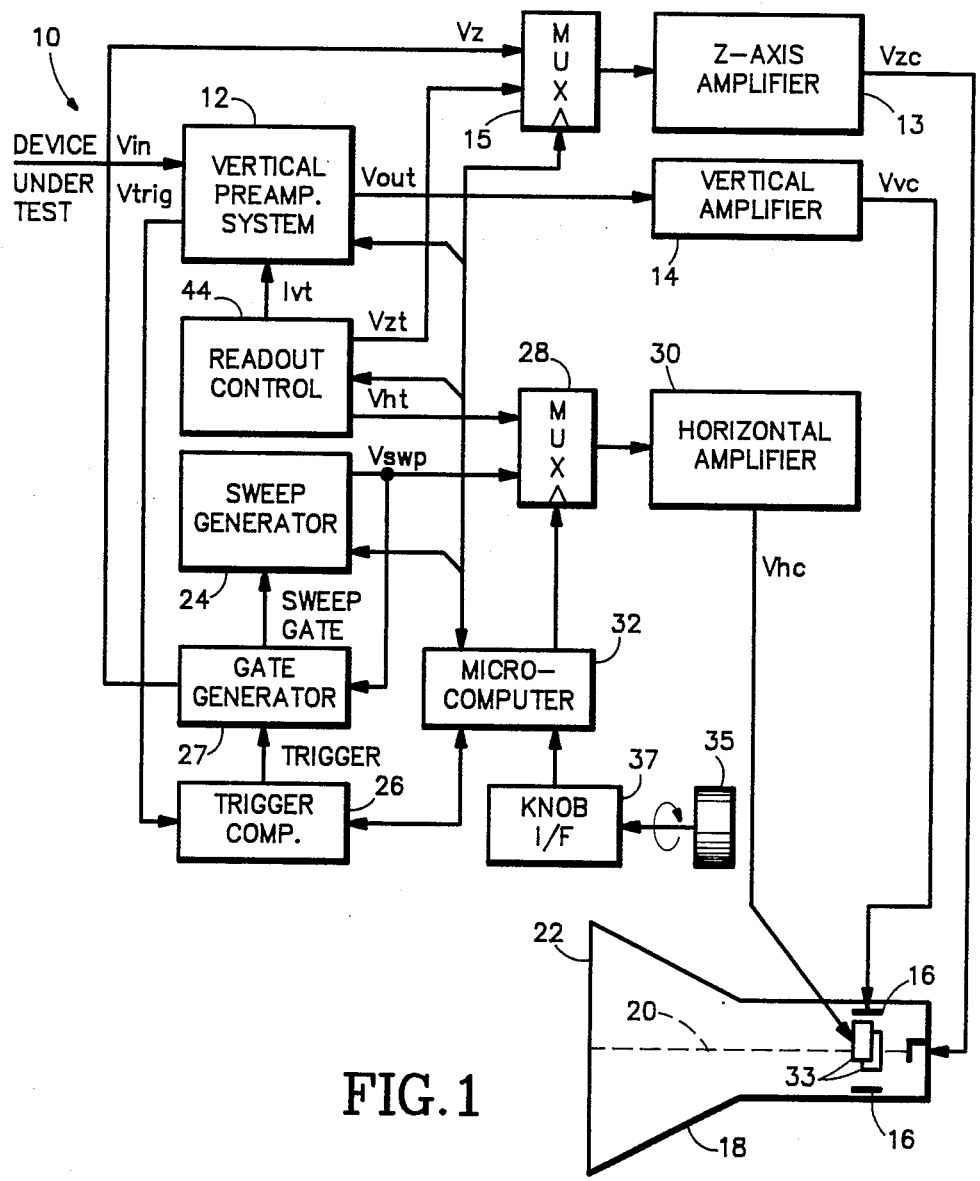
FIG. 1 is a block diagram of an oscilloscope according to the present invention.

Referring to FIG. 1 depicting in block diagram form an oscilloscope 10 according to the present invention, oscilloscope 10 includes a vertical preamplifier system 12 adapted to produce an output signal Vout selectively controlled by an input signal Vin generated by a device under test or by an input signal Ivt produced by a readout control circuit 44. Vout is applied as input to a vertical amplifier 14 producing a vertical control signal Vvc proportional to Vout, Vvc being applied across plates 16 in a cathode ray tube (CRT) 18 for controlling the vertical position of a beam 20 on a screen 22 of CRT 18. Oscilloscope 10 also includes a sweep generator 24 for producing a sweep signal Vswp which increases linearly with time (sweeps) from a predetermined starting level, the sweep continuing as long as the sweep generator detects assertion of a sweep gate signal as may be produced by a gate generator circuit 27. The sweep gate signal suitably commences immediately following gate generator 27 receipt of a trigger signal as may be produced by a trigger comparator 26. The Vswp signal is fed back to the gate generator 27 which continues to assert the sweep gate signal until Vswp reaches a predetermined ending level. Vswp is applied through a multiplexer 28 to an input of a horizontal amplifier 30 producing a horizontal control signal Vhc applied across plates 33 for controlling the horizontal position of beam 20 on screen 22. Trigger comparator 26 typically produces the trigger signal in relation to an input trigger source signal Vtrig produced by vertical preamplifier system 12 in response to Vin.

The intensity of beam 20 is controlled by the magnitude of an output signal Vzc of a "Z-axis" amplifier 13, Vzc being proportional to the output of a multiplexer 15. A voltage Vz produced by gate generator 27 provides one input to multiplexer 15 while an output signal Vzt produced by the readout control circuit 44 provides an additional input to multiplexer 15. The readout control circuit 44 also supplies an output voltage Vht provided as an alternative input to horizontal amplifier 30 through multiplexer 28 and produces the output current Ivt applied as input to vertical preamplifier system 12.

A microcomputer 32 controls the switching positions of multiplexers 15 and 28, sets the slew rate of the sweep signal Vswp supplied by sweep generator 24, and determines the trigger level utilized in trigger comparator 26. Microcomputer 32 transmits control signals to vertical preamplifier system 12 for selecting whether Vout is to be controlled by Vin or Ivt, and for determining the ratio of Vout to Vin (the preamplifier gain). Microcomputer 32 also communicates with readout control circuit 44 for purposes described hereinbelow. A knob 35, mounted on the front panel of the oscilloscope, supplies input to a knob interface circuit 37 which in turn provides data to the microcomputer 32 indicating the direction and amount of knob rotation. The microcomputer utilizes the knob rotation data to adjust an operating parameter which controls the display of a cursor on screen 22 in a manner described hereinbelow.

Figure 2:
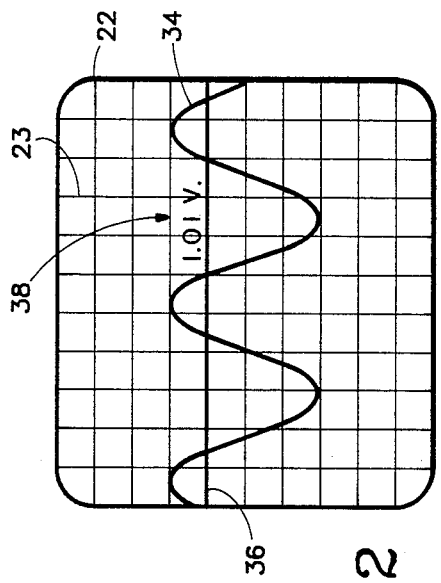
FIG. 2 is an illustration of a display produced on the screen of the oscilloscope of FIG. 1.

FIG. 2 shows a typical display which may be produced on oscilloscope screen 22 according to the present invention, the display including a waveform 34, a cursor 36 and magnitude data 38. The screen 22 is segmented by a grid 23 superimposed on the screen so as to permit an operator to gauge the vertical and horizontal displacement of any point on waveform 34 from a reference point on the grid in terms of vertical and horizontal grid divisions. The cursor 36 is displayed in the form of a horizontal line extending across screen 22, having a vertical position controlled by cursor level data supplied as input to the readout control circuit 44 of FIG. 1 by microcomputer 32. The magnitude data 38 displayed immediately above the cursor 36 indicates a voltage represented by the vertical position of the cursor.

When the beam 20 of FIG. 1 is to create or refresh waveform 34 on screen 22, microcomputer 32 switches multiplexers 15 and 28 so that the Vswp signal supplied by sweep generator 24 and the Vz signal, produced by the gate generator 27 when the sweep gate signal is asserted, determine the magnitudes of the beam's horizontal and intensity control signals (Vhc and Vzc). The magnitude of the vertical control signal Vvc is determined by the Vout signal provided by vertical preamplifier system 12 according to the magnitude of Vin. When the beam is to create or refresh the display of cursor 36 and magnitude data 38, microcomputer 32 switches multiplexers 15 and 28 so that the Vht and Vzt outputs of readout control circuit 44 determine the magnitudes of the beam's horizontal and intensity control signals. When the cursor and magnitude data display is being created, the magnitude of the beam's vertical control signal Vvc is also determined by the Vout signal outputted by vertical preamplifier system 12, but in this case, the magnitude of Vout is not determined by Vin but is determined by the Ivt signal produced by readout control circuit 44 according to cursor level data supplied to readout control circuit 44 by microcomputer 32. Readout control circuit 44 produces a sequence of vertical output signal Ivt levels, a sequence of horizontal output signal Vht levels, and a sequence of Z-axis control signal Vzt levels, the sequences being synchronized so as to create the cursor and magnitude data displays on a pixel-by-pixel basis. The synchronized Ivt and Vhz signal levels determine the vertical and horizontal position on the screen of each pixel making up cursor 36 and the magnitude data 38, while the Vzt signal causes each pixel to be illuminated by the beam.

Thus by appropriately selecting cursor level data supplied to readout control circuit 44, microcomputer 32 may initiate the display of cursor 36 and magnitude data 38 superimposed over waveform display 34. The ability to vertically position the horizontal cursor 36 is useful, for example, in providing a graphical representation of the trigger level that the trigger comparator 26 utilized to initiate the trigger signal. The cursor level and magnitude data is also utilized to display the value of other voltages to be determined by the oscilloscope. For example, according to the present invention as described in detail hereinbelow, the oscilloscope is adapted to measure the minimum or maximum peak level of the vertical preamplifier system input signal Vin, and the horizontal cursor 36 and magnitude data 38 may also be utilized to display the results of such peak level measurements.

Figure 3:
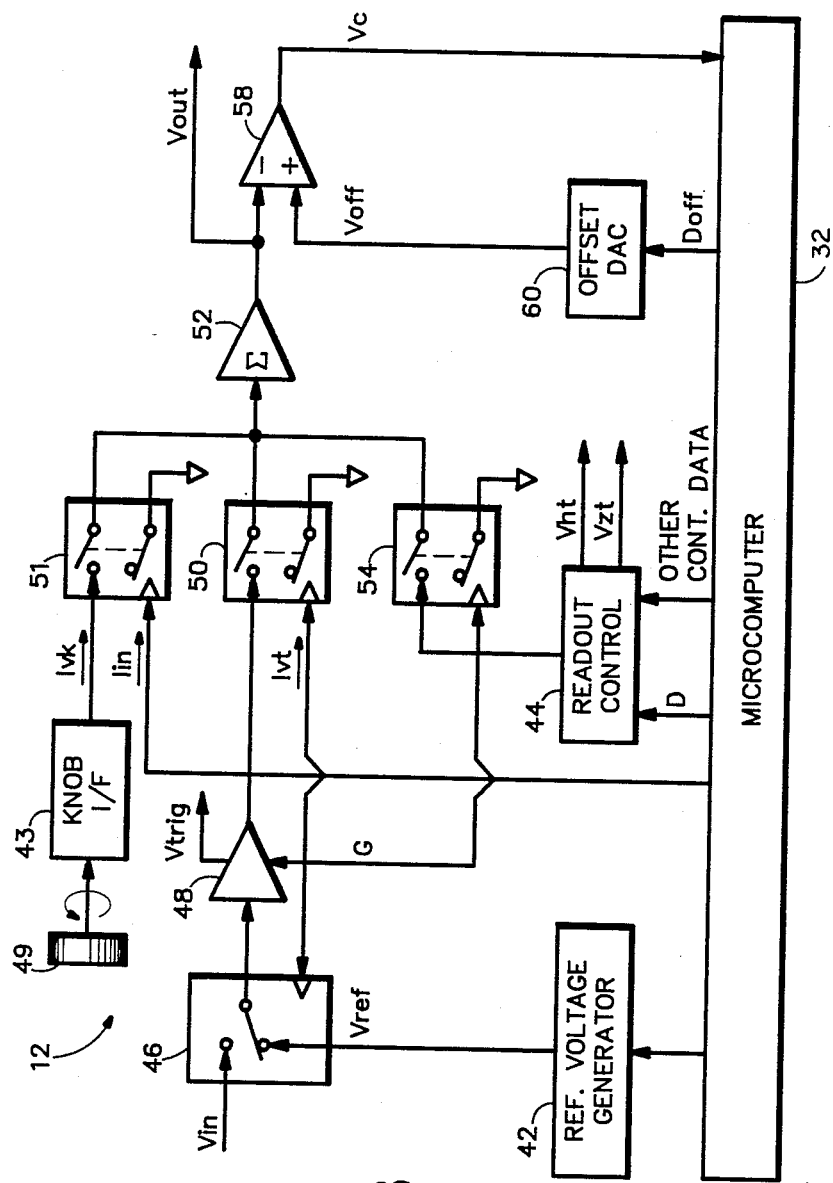
FIG. 3 is a block diagram of the vertical preamplifier system, the readout control circuit, and the microcomputer of the oscilloscope of FIG. 1.

Referring to FIG. 3, depicting microcomputer 32 readout control circuit 44, and vertical preamplifier system 12 of FIG. 1 in block diagram form, the magnitude of the output signal Vout supplied by system 12 may be controlled by the input signal Vin generated by the device under test, by a reference signal Vref formed by a reference voltage generator 42, by a current Ivk produced by a knob interface circuit 43 or by current Ivt produced by readout control circuit 44. The input signal Vin or reference signal Vref may alternatively be connected through a switch 46 to the input of a vertical channel preamplifier 48 which supplies an output current Iin and the trigger source signal Vtrig each of magnitude varying with the voltage of the preamplifier input signal, Vin or Vref. Current Ivk may be increased or decreased by an operator rotating a knob 49 mounted on the front panel of the oscilloscope, knob rotation being sensed with knob interface circuit 43. Currents Iin, Ivk, and Ivt may be applied through switches 50, 51 and 54, respectively, to an input of a summing amplifier 52, a transresistance amplifier which supplies the vertical channel output voltage Vout in proportion to the sum of its input currents. When not connecting current Iin to the input of summing amplifier 52, switch 50 grounds Iin, when not connecting current Ivk to the input of summing amplifier 52, switch 51 grounds Ivk, and when not connecting current Ivt to the summing amplifier input, switch 54 grounds Ivt. The switching positions of switches 46, 50, 51 and 54 are controlled by means of microcomputer 32.

In addition to supplying input to vertical amplifier 14 of FIG. 1, the Vout signal also controls an inverting input of a comparator 58. An "offset" digital-to-analog converter (DAC) 60 produces an output signal Voff applied to the noninverting input of comparator 58 which transmits a binary output signal Vc to microcomputer 32, Vc being high when Voff is greater than Vout and low when Vout is greater than Voff. Microcomputer 32 produces digital output data Doff applied to the input of offset DAC 60 and also supplies the previously mentioned cursor level data D, as well as other control data, as input to readout control circuit 44 to control the magnitude of its output current Ivt.

The vertical position of the beam is controlled according to the sum of the input currents supplied to summing amplifier 52. To form the waveform display 34 of FIG. 2, microcomputer 32 sets switch 46 of FIG. 3 to couple Vin as the input to preamplifier 48, sets switches 50 and 51 to provide Iin and Ivk as inputs to summing amplifier 52, sets switch 54 to ground Ivt, and sets multiplexers 15 and 28 of FIG. 1 to connect Vz and Vswp as the inputs to Z-axis amplifier 13 and horizontal amplifier 30 respectively. To bring about display of horizontal cursor 36 and cursor magnitude data 38, microcomputer 32 sets switch 50 to ground Iin, sets switches 54 and 51 to supply Ivt and Ivk as inputs to summing amplifier 52, and sets multiplexers 15 and 28 of FIG. 1 to couple the output signals Vzt and Vht of readout control circuit 44 as the inputs to Z-axis amplifier 13 and horizontal amplifier 30 respectively. An operator can control the relative vertical position of the waveform display and the cursor and magnitude data display with respect to the grid by rotating knob 49 to increase or decrease Ivk.

According to the present invention, microcomputer 32 utilizes reference voltage generator 42, comparator 58 and offset DAC 60 of FIG. 3 to experimentally determine vertical offset and gain parameters characterizing the response of vertical preamplifier 48. The vertical offset parameter $Dvo(G)$ is the value of cursor level data D which must be applied to readout control circuit 44 to place cursor 36 of FIG. 2 on oscilloscope screen 22 at a vertical position representing ground level in the input signal Vin applied to preamplifier 48. The vertical gain parameter $Gv(G)$ represents the change in cursor level data D required to increase readout control circuit 44 vertical output current Ivt by the same amount that vertical preamplifier 48 output current Iin is increased when the input Vin to the vertical preamplifier is increased from ground by a voltage nominally corresponding to one vertical grid division on oscilloscope screen 22 of FIG. 2. The vertical gain parameter Gv(G) and the vertical offset parameter Dvo(G) vary with the gain of preamplifier 48 of FIG. 3, the gain being controlled by the value of gain data G produced by microcomputer 32 and supplied to a control input of preamplifier 48.

The vertical offset and gain parameters are utilized to calculate the value of cursor level data D needed to cause readout control circuit 44 to vertically position cursor 36 relative to waveform 34 on screen 22 of FIG. 2 to reflect any desired voltage V according to the following expression:

$$D = [V*Gv(G)/Vr(G)] + Dvo(G) \quad [1]$$

where Vr(G) is the nominal voltage range setting of the oscilloscope (volts per vertical grid division), also a function of G. Dvo(G) is expressed in terms of cursor level data units while Gv(G) is expressed in terms of cursor level data units per vertical division of the grid on screen 22.

The values of Gv(G) and Dvo(G) are determined according to the following steps 1–5.

1. Microcomputer 32 sets switches 50, 51 and 54 to ground currents Iin, Ivk and Ivt so that no current is supplied to the input of summing amplifier 52. Microcomputer 32 then utilizes an iterative search routine wherein it varies the value of the input data Doff to offset DAC 60 while monitoring the Vc output of comparator 58 to determine a value of Doff for which offset DAC 60 produces a Voff signal substantially equal to Vout causing comparator 58 to generate a "borderline" output signal Vc. Vc is "borderline" when it is between high and low logic levels, or when it is either high or low but will change state if Doff is increased or decreased by the weight of one least significant bit. This value of Doff, when applied to comparator 58, compensates for any inherent offsets in summing amplifier 52 and comparator 58 so that when the input current to summing amplifier 52 is slightly above 0 level, Vc is low, and when the input current to summing amplifier 52 is slightly below 0, Vc is high. This compensating value of Doff is applied to the input of offset DAC 60 during the remaining steps 2–5 described hereinbelow.

2. Microcomputer 32 sets switches 50 and 51 to ground currents Iin and Ivk, sets switch 54 to connect Ivt to summing amplifier 52, and sets readout control circuit 44 to a "frozen" state wherein its output current Ivt is determined by the cursor level data D but wherein Vht and Vzt are "frozen" to constant values. With the readout control circuit 44 "frozen", microcomputer 32 utilizes an iterative search routine to vary the cursor level data D while monitoring the output Vc of comparator 58 to determine the magnitude (Drov) of cursor level data D which produces a "borderline" comparator output signal Vc with respect to changes in value of cursor level data. Ideally, when the cursor level data D is 0, the vertical output current Ivt produced by readout control circuit 44 would also be 0. However readout control circuit 44 has an inherent offset and Drov is the "vertical offset error" of readout control circuit 44, the actual value of the cursor level data needed to ensure that Ivt is zero and not positive or negative.

3. With readout control circuit 44 still frozen, microcomputer 32 sets the value of range control data G applied to preamplifier 48 for its lowest range, sets switch 51 to ground Ivk, and sets switches 50 and 54 to connect both currents Iin and Ivt to the input of summing amplifier 52 so that Vout is controlled by the sum of Iin and Ivt. Microcomputer 32 also sets switch 46 to connect Vref to the input of vertical preamplifier 48, so that Vref controls Iin, and sets reference voltage generator 42 produce its output voltage Vref at ground level. While monitoring the Vc output of comparator 58, microcomputer 32 again iteratively adjusts the cursor level data D input to readout control circuit 44 to determine a value Dvon(G) of cursor level data D which produces a "borderline" Vc output from comparator 58 with respect changes in cursor level data. Dvon(G) is the "null vertical preamplifier offset", the value of input data D to readout control circuit 44 which causes Ivt to be of substantially equal magnitude but opposite direction to Iin when the input to preamplifier 48 is grounded, such that the net input to summing amplifier 52 is 0. The value of Dvon(G) changes with the gain setting G of preamplifier 48. If preamplifier 48 were "ideal", its output current Iin would be 0 when its input is grounded, but preamplifiers normally have an inherent offset such that Iin is other than 0 when the preamplifier input is grounded. The quantity [Drov−Dvon(G)] is therefore a measure of the offset ("the vertical preamplifier null offset error") produced by preamplifier 48 in terms of the change in cursor data supplied to readout control circuit 44 required to change Ivt by the same amount as the offset in Iin produced by preamplifier 48. Microcomputer 32 computes the value of Dvo(G), the parameter characterizing the vertical offset error of vertical preamplifier 48, as the sum of the readout circuit offset error Drov and the vertical preamplifier null offset error [Drov(G)−Dvon] as indicated by the expression:

$$Dvo(G) = Drov + [Drov - Dvon(G)]$$

or, equivalently, $$Dvo(G) = 2*Drov - Dvon(G).$$

This value, Dvo(G), is the cursor level data value which would cause readout control circuit 44 to position the cursor at the same vertical position on the screen as a point on a displayed waveform representing ground level in Vin.

4. With readout control circuit 44 still in the frozen state, and switches 46, 50, 51 and 54 set as in step 3, microcomputer 32 changes the value of the reference voltage Vref output of reference voltage generator 42 so that it has the value V×(G) nominally required to vertically displace the beam by 5 grid divisions from its position on the oscilloscope screen when Vref was at ground level. While monitoring the Vc output of comparator 58, microcomputer 32 again iteratively adjusts the cursor level data D input to readout control circuit 44 to determine the value Dvgo(G) of cursor level data D which places the output Vc of comparator 58 in the borderline state with respect to changes in cursor level data. Dvgo(G) is the "preamplifier vertical gain offset", the value of input data D to readout control circuit 44 which causes Ivt to be substantially equal and opposite to Iin when the input to the preamplifier 48 is at the 5 vertical grid division level, so that the net input to summing amplifier 52 is 0. The vertical gain parameter Gv(G), hereinabove defined as the change in cursor level data D required to increase Ivt by the same amount that the vertical preamplifier 48 output current Iin is increased when Vin is increased from ground to the voltage nominally corresponding to one vertical grid division, is determined according to the expression:

$$Gv(G) = [Dvon(G) - Dvgo(G)] * [Vr(G)/Vx(G)] \quad [2]$$

5. The microcomputer 32 repeats steps 3 and 4 for each vertical range, using the appropriate value of range control data G input to preamplifier 48 and computing Dvo(G) and Gv(G) for each range.

In each of steps 2–4, microcomputer 32 utilized a search routine to iteratively adjust the value of the cursor level data D which causes comparator 58 to produce a "borderline" output signal Vc. FIG. 4 is a flowchart of a suitable program for causing microcomputer 32 to perform a search routine wherein the value of D is modified by progressively smaller amounts to find the borderline value of D. Starting in block 70, an index N is set to 0 and then (block 72) the cursor level data D is set to its midrange value Dmid. The microcomputer then checks whether Vc is high or low (block 74) and if high, increments D by the value of DELTA/$2^N$ (block 76), where DELTA is one half the range of D. Alternatively, if Vc is low, the microcomputer decrements D by DELTA/$2^N$ (block 78). After the value of D is adjusted in block 76 or in block 78, N is incremented in block 80. If DELTA/$2^N$ is not less than one (block 83), the program returns to block 74 and continues to loop through blocks 74, 76 (or 78), 80 and 83, adjusting D by increasingly smaller amounts as N is increased, until D is adjusted by the weight (1) of its least significant digit. When DELTA/$2^N$ is less than 1 (block 83), the search process stops and the last value of D is the value which produces the "borderline" output signal Vc. The appropriate value for Doff found in step 1 can be obtained utilizing a substantially similar search routine.

It should be noted that while equation [1] above includes the parameter Vr(G), the nominal voltage range setting, the value of D computed in equation [1] is actually independent of Vr(G). This can be seen by substituting the expression for Gv(G) of the above equation [2] into equation [1] which results in the expression:

$$D = V*[Dvon(G) - Dvgo(G)]/Vx(G) + Dvo(G). \quad [3]$$

Equation [3] shows that D is a function only of measured parameters characterizing the actual behavior of the vertical preamplifier system and the value $Vx(G)$ of the reference signal utilized to measure those parameters. The cursor level data D, when computed according to the above expression, vertically positions the cursor on the screen, not in relationship to the grid so as to indicate a nominal voltage level, but rather in relationship to the displayed waveform so as to indicate an actual voltage level with respect to voltage levels represented by the waveform. When the cursor level data D is set according to equations [1] or [3], the magnitude data displayed above the cursor represents the actual voltage V of any points on the input signal corresponding to points on the displayed waveform intersected by the cursor, irrespective of any offset or gain error in the vertical preamplifier.

Microcomputer 32 of FIG. 1 permits an oscilloscope operating mode wherein the microcomputer adjusts the cursor level data in proportion to the rotation of knob 35 whereby an operator may adjust the vertical position of the cursor on the screen by rotating knob 35 so that it intersects the displayed waveform at any selected level. The microcomputer computes the voltage V to be indicated by the magnitude data displayed above the cursor from the value of the cursor level data D set by knob rotation according to the expression:

$$V = [D - Dov(G)] * Vr(G)/Gv(G),$$

which expression may be derived by solving equation [1] for V. When computed according to this expression, the magnitude data displayed above the cursor indicates the voltage of points on the input signal corresponding to the points in the waveform intersected by the cursor. Thus the operator can easily determine the magnitude of the input signal at any point by positioning the cursor to intersect waveform at the corresponding point. Moreover, the magnitude determined in this fashion is more accurate than when the magnitude of the point on the waveform is determined by measuring the vertical displacement of the point in relation to a nominal reference point on the grid and multiplying the displacement by the nominal gain of the oscilloscope, since the measurement utilizing the cursor is unaffected by preamplifier offset and gain errors.

The readout control circuit 44 of FIG. 3 produces the display of the cursor 36 and the cursor magnitude data 38 of FIG. 2 by causing a row of thirty-two characters of the type shown in FIGS. 5 and 6 to be displayed across the screen. Each character is formed by a sixteen pixel high and eight pixel wide array, each pixel being represented in FIGS. 5 and 6 by a small square such as square 79. Some pixels (those identified by an "X" as in square 81) are illuminated by the beam to form the shape of an underlined number or a letter as shown in FIG. 5, or to form a simple underline as shown in FIG. 6. The characters are selected and arranged in the row so that the underlines form cursor 36 of FIG. 2 and so that the letters and numbers form magnitude data 38 of FIG. 2.

Figures 7, 8:
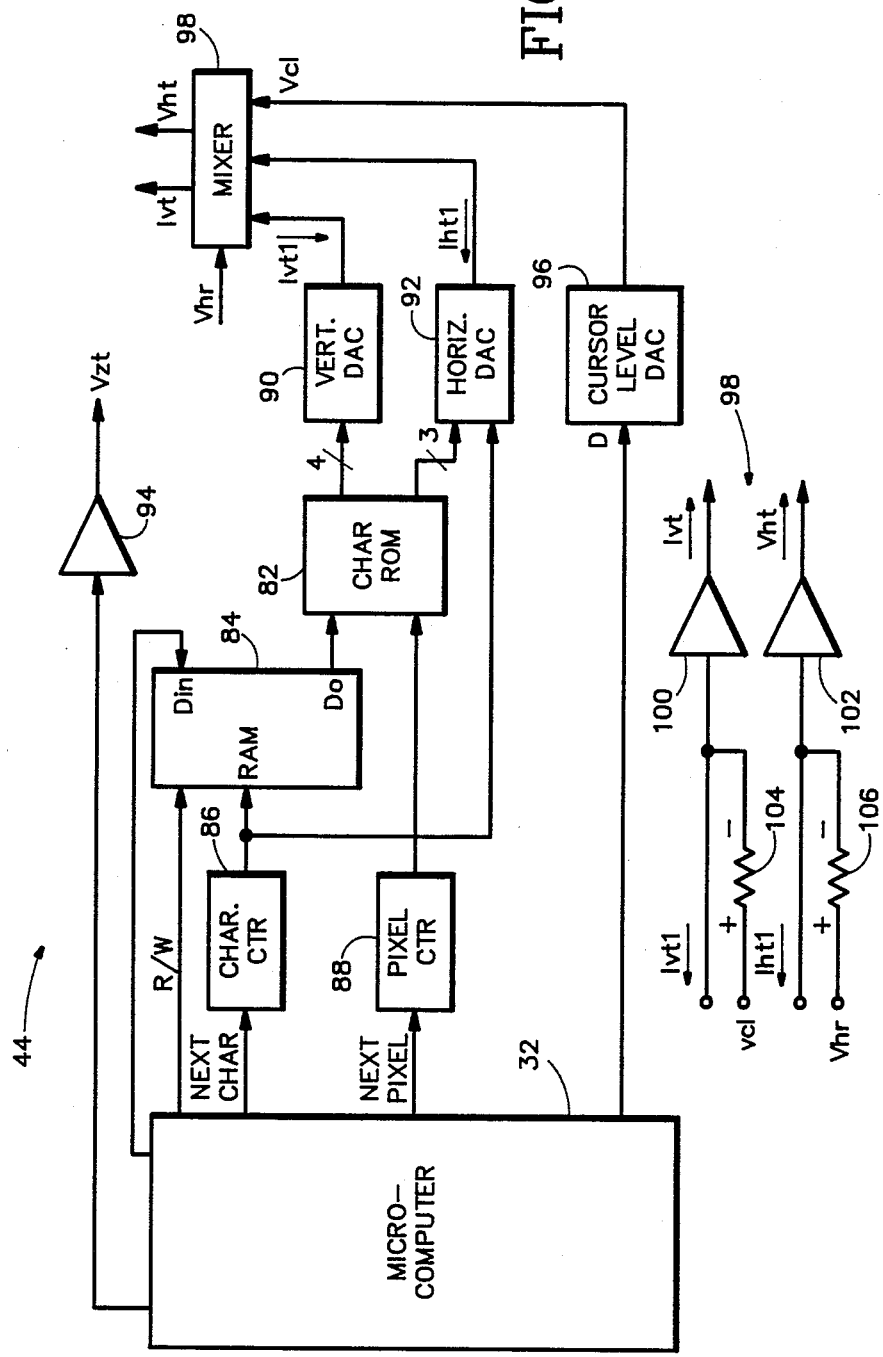
FIG. 7 is a block diagram of the readout control circuit and the microcomputer of FIG. 3.
FIG. 8 is a schematic diagram of the mixer of FIG. 7.

FIG. 7 includes a detailed block diagram of readout control circuit 44 of FIG. 3 and further includes a block representing microcomputer 32 of FIG. 3. Readout control circuit 44 utilizes a character read only memory (ROM) 82 storing data indicating which pixel is to be illuminated for each character of all possible characters which may be displayed. Microcomputer 32 writes data representing the thirty-two characters making up the cursor/magnitude data display into consecutive addresses in a random access memory (RAM) 84 having an input data port for data from microcomputer 32 and an output data port connected to address terminals of character ROM 82. RAM 84 is addressed by a count output of a character counter 86 which counts occurrences of a "NEXT CHAR" signal generated by microcomputer 32. A pixel counter 88 counts occurrences of a "NEXT PIXEL" signal, also produced by microcomputer 32, the output of the pixel counter controlling additional address terminals of character ROM 82. The cursor 36 and magnitude data 38 displayed on screen 22 of FIG. 2 is updated on a character-by-character basis and the display of each character is updated on a pixel-by-pixel basis. The microcomputer 32 generates the NEXT PIXEL signal once for each pixel in each character and generates the NEXT CHAR signal once for each character in the row. The NEXT CHAR and NEXT PIXEL signals are synchronized such that a NEXT PIXEL signal is generated for each pixel in a character. The data in character ROM 82 is arranged such that it stores for each pixel of each character type four bits indicating a relative elevation in pixels (0-15) of the pixel from the top pixel row of a character and three bits indicating a relative horizontal displacement in pixels (0-7) of the pixel from the right pixel column of a character. The current pixel being updated is determined by the combination of the character and pixel counts produced by character counter 86 and pixel counter 88. RAM 84 converts the character count to output data which addresses an area in character ROM 82 wherein the data for the appropriate character type to be displayed is stored, and the pixel count addresses the storage location of data for the particular pixel to be displayed.

The four bit elevation data stored by character ROM 82 is supplied as input to a vertical DAC 90 which sinks an output current Ivtl proportional to the value represented by its four bit input. The three bit horizontal position data stored by character ROM 82 controls the three least significant input bits of a horizontal DAC 92, and the character count utilized to address RAM 84 provides additional input bits to horizontal DAC 92. Horizontal DAC 92 sinks an output current Ihtl proportional to the value of its input data, which indicates the horizontal displacement of the pixel being updated from the right edge of the oscilloscope screen. The cursor level data D produced by microcomputer 32 is converted by a cursor level DAC 96 to a cursor level voltage Vcl of magnitude proportional to the cursor level data. The Ivtl, Ihtl and Vcl signals produced by DACs 90, 92 and 96, along with a constant reference voltage Vhr, provide inputs to a mixer circuit 98 which supplies the Ivt and Vht output signals of readout control circuit 44 in response to its input signals. Microcomputer 32 provides an output signal which drives a buffer 94 producing the Vzt output of readout control circuit 44. Microcomputer 32 synchronizes the Vzt signal with the Ivt and Vht signals so as to illuminate each pixel of each character.

The mixer circuit 98, shown in detailed schematic diagram form in FIG. 8, includes a transconductance amplifier 100 for forming Ivt, a voltage amplifier 102 for supplying Vht, a resistor 104 coupling Vcl to the input of amplifier 100, and a resistor 106 coupling reference voltage Vhr to the input of amplifier 102. The output current Ivtl of vertical DAC 90 of FIG. 7 is applied directly to the input of amplifier 100 while the output current Ihtl of horizontal DAC 92 of FIG. 7 is applied directly to the input of amplifier 102. The value of Vcl (proportional to the cursor level data) determines the vertical position of the cursor by setting the vertical position on the screen of the top row of pixels of each character, the cursor appearing 14 pixels therebelow. The value of Ivtl determines the vertical displacement (in pixels) of the pixel presently being updated from the top pixel row of the character. When Ivtl is 0, the drop across resistor 104 is 0, the input to amplifier 100 is at the level of Vcl, and Ivt is a maximum. In such case a pixel in the top row of a character will be updated. As Ivtl is increased to a maximum value, Ivt decreases to a minimum. The value of resistor 104 is selected such that when Ivtl is a maximum, Ivt is at a value which positions the beam at the bottom pixel row of the character. The value of Ivtl, produced when the readout control circuit is frozen, sets the beam to the position of pixel 81 of FIG. 5.

The value of the horizontal reference voltage Vhr is set such that when Ihtl is 0, the value of Vht produced by amplifier 102 is appropriate to position the beam on a pixel along the right edge of the screen. As Ihtl is increased, the voltage drop across resistor 106 increases, decreasing Vht so as to move the beam to the left. The value of resistor 106 is selected such that when Ihtl is a maximum, Vht is at a value which positions the beam along the left edge of the screen.

Figure 9:
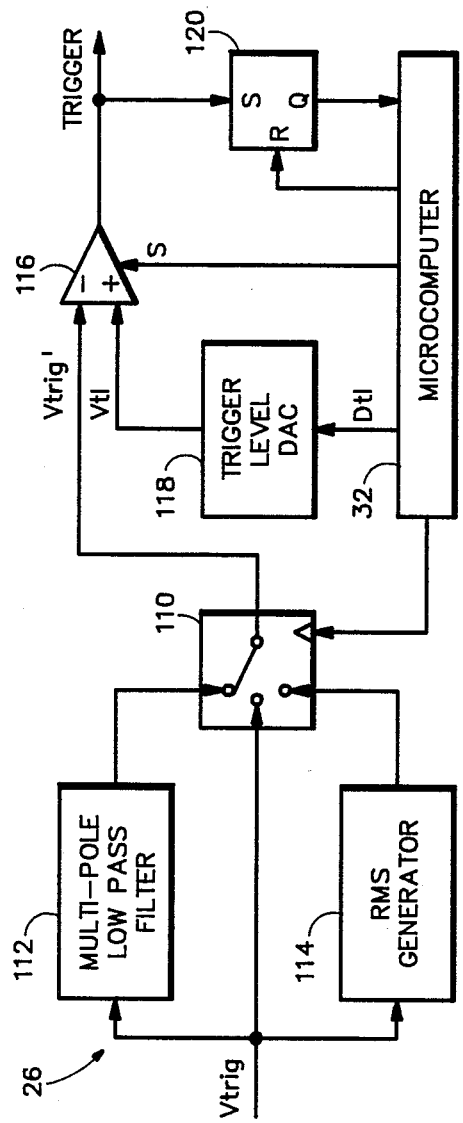
FIG. 9 is a block diagram of the trigger comparator and the microcomputer of FIG. 1.

Referring to FIG. 9, depicting in detailed block diagram form trigger comparator 26 of FIG. 1, trigger comparator 26 is adapted not only to output the trigger signal relative to the trigger source signal Vtrig, but is also adapted according to the present invention to enable microcomputer 32 to measure the maximum (or minimum) peak magnitude, the RMS value or the DC level of vertical preamplifier system 12 input signal Vin. The trigger source signal Vtrig supplied by vertical preamplifier 48 of FIG. 3 in response to the Vin signal is applied to an input terminal of a three-position switch 110, to an input of a multi-pole low pass filter 112, and to an input of an RMS converter 114. The outputs of low pass filter 112 and RMS converter 114 provide additional inputs to switch 110. The output Vtrig' of switch 110 is applied to an inverting input of a comparator 116. Switch 110 is controlled by microcomputer 32. Microcomputer 32 transmits trigger level data Dtl to a trigger level DAC 118, which forms an output signal Vtl proportional in magnitude to Dtl, and Vtl is applied to a noninverting input of comparator 116. Comparator 116 compares the magnitudes of Vtrig' and Vtl and suitably controls the state of its output, the trigger signal, based on whether Vtrig' exceeds Vtl. A "sense" signal S, generated by microcomputer 32 is supplied to a control input to comparator 116, and when S is high, comparator 116 sets the trigger signal high to indicate when Vtrig' rises above Vtl. When S is low, comparator 116 sets the trigger signal high to indicate when Vtrig' falls below Vtl. The trigger signal, in addition to providing a control input to the gate generator 27 of FIG. 1, also controls the set input of an R/S flip-flop 120. Microcomputer 32 controls the reset input of flip-flop 120 and monitors its Q output.

To determine a maximum peak of vertical preamplifier system input signal Vin, microcomputer 32 sets switch 46 of FIG. 3 to connect Vin to the input of vertical preamplifier 48, sets switch 110 to provide its Vtrig input as its Vtrig' output, sets the trigger level input data Dtl to trigger level DAC 118 of FIG. 9 to a midrange value, and sets the sense signal S input to comparator 116 high. Microcomputer 32 then monitors the flip-flop Q output and periodically adjusts the DAC input data Dtl up or down by progressively smaller amounts (resetting flip-flop 120 after each adjustment) to iteratively determine the value Dpmax of trigger level DAC 118 input data Dtl which puts the trigger signal in a "borderline" state. Dpmax is thus a measure of the maximum peak value of Vtrig' in terms of trigger level DAC input data Dtl required to cause the trigger level DAC to produce a trigger level voltage Vtl which substantially matches the maximum peak value of Vtrig'. Since Vtrig' is proportional to Vin, Dpmax is also a representation of the maximum peak value of Vin. The minimum peak value for Vin is measured in a similar fashion except that the sense signal S input to comparator 116 is driven low so that comparator 116 drives the trigger signal high as Vtrig' falls below the Vtl. The value Dpmin of trigger level input data which places the trigger signal in a "borderline" state is a measure of the minimum peak value of Vtrig' and is therefore representative of the minimum peak value of Vin.

According to the present invention, the microcomputer 32 determines the voltage of the maximum or minimum peak of the input signal Vin from Dpmax or Dpmin according to the expression:

$$Vin(peak) = [Dpm - Dtlo(G,S)] * [Vtlr(G)/Gtl(G)] \quad [4]$$

where Dpm is Dpmax or Dpmin, depending on which peak (maximum or minimum) is being measured, where Dtlo(G,S) and Gtl(G) are offset and gain parameters characterizing the response of the vertical preamplifier 48, and where Vtlr(G) indicates the nominal range setting of preamplifier 48 (in vertical grid divisions per volt). The trigger offset parameter Dtlo(G,S) represents the value of trigger level DAC input data which would cause the trigger level DAC 118 to produce an output trigger level substantially matching the Vtrig' signal when the input to the vertical preamplifier 48 is grounded for a given combination of G and S. The trigger gain parameter Gtl(G) represents the change in trigger level DAC 118 input data Dtl which would cause the DAC output signal Vtl to increase by substantially the same amount that the Vtrig' would increase when the input to the vertical preamplifier 48 is increased by the nominal voltage represented by one vertical grid division for a given value of G. Dtlo(G,S), Gtl(G) and Vtlr(G) are all functions of the gain data G supplied to the preamplifier 48 by microcomputer 32. The offset parameter Dtlo(G,S) is additionally affected by whether S is high or low (i.e. logical 1 or logical 0). When Dpmax is measured, S is 1; when Dpmin is measured, S is 0. Thus S has values 1 and 0, respectively, in equation [4] depending on whether the maximum or minimum peak is measured.

Dtlo(G,S) and Gtl(G) are measured according to the following steps:

1. Microcomputer 32 sets reference voltage generator 42 of FIG. 3 to produce Vref at ground level, sets G to a minimum value, sets the sense input signal S to comparator 116 of FIG. 9 high (logical 1), and sets switch 46 to connect Vref to the input of preamplifier 48. Microcomputer 32 thereafter performs a search wherein it iteratively adjusts Dtl by progressively smaller amounts, checking and then resetting the Q output of flipflop 120 between adjustments. The object of the search is to find the value of Dtl which places the trigger signal in a "borderline" state wherein a change in Dtl by the weight of one least significant digit changes the state of flip-flop 120. This value is Dtlo(G,S) for S=1 and minimum G.

2. Step 1 is repeated for each additional combination of G and S to determine the value of Dtlo(G,S) for each such combination.

3. Microcomputer 32 again sets G to a minimum value, sets reference voltage generator 42 to produce Vref at a level corresponding to a potential difference V×(G) nominally represented by five vertical grid divisions at the current range setting, sets the sense input signal S to comparator 116 high (logical 1), sets switch 46 to connect Vref to the input of preamplifier 48, and then iteratively adjusts Dtl by progressively smaller amounts, checking and resetting the Q output of flip-flop 120 at least one Vin period after Dtl is last adjusted, in order to find the value of Dtl which again puts the trigger signal in the "borderline" state. This value is defined as Dtl×(G). The microcomputer then computes Gtl(G) for the lowest value of G according to the expression:

$$Gtl(G) = [Dtl \times (G) - Dtlo(G,1)] * [Vtlr(G)/V \times (G)] \quad [5]$$

4. Step 3 is repeated for each value of G above minimum such that Gtl(G) is determined for each value of G.

It should be noted that although equation [4] includes Vtlr(G), the nominal gain of the trigger system, the measured peak Vin(peak) of the input signal to the trigger system does not in fact depend on the nominal gain, as can be determined by substituting the expression for Gtl(G) in equation [5] into equation [4] to obtain the expression:

$$Vin(peak) = [Dpm - Dtlo(G,S)] * [V \times (G)/[Dtl \times (G) - Dtlo(G,S)]]$$

Since Vin(peak) is a function only of measured parameters and the reference voltage V×(G), it is seen that the measured value of Vin(peak) is unaffected by any offset or gain error in the vertical preamplifier 48.

Thus as has been described hereinabove, vertical, horizontal, and Z-axis control signals (Ivt, Vht, and Vzt) produced by the readout control circuit 44 of FIG. 3 are respectively multiplexed with the output signal Iin of the vertical preamplifier 48, the sweep signal Vswp, and the Z-axis control signal Vs so that the readout control circuit may cause the beam to form a cursor on an oscilloscope screen at a vertical level controlled by cursor level data provided by microcomputer 32 and to form characters on the screen indicating a voltage represented by the vertical level of the cursor. According to the present invention, vertical offset and gain parameters characterizing vertical preamplifier 48 of FIG. 3 are utilized to determine the value of cursor level data needed to cause the readout circuit to vertically position the cursor on the screen and adjust the magnitude data so as to accurately reflect any desired voltage on the waveform regardless of any offset or gain error associated with the vertical preamplifier system.

Also, according to the present invention, the oscilloscope trigger comparator 26 of FIG. 9 is adapted to permit microcomputer 26 to measure the maximum (or minimum) peak magnitude of the vertical preamplifier input signal Vin in terms of the magnitude of input data which must be supplied to the trigger level DAC 118 in order to cause the DAC to produce an output signal matching the level of the trigger source signal Vtrig produced by the vertical preamplifier 48 in response to Vin. Trigger offset and gain parameters characterizing the response of the vertical preamplifier to an input signal Vin are utilized to convert measurements of input signal peak amplitudes expressed in terms of trigger level DAC input data, to corresponding voltages.

Oscilloscope 10 is also adapted to measure the RMS value of the DC level of Vin. RMS converter 114 of FIG. 9 produces a DC output signal of magnitude equal to the RMS value of Vtrig. When switch 110 connects the output of RMS converter 114 as the Vtrig' input to comparator 116, the value of Vin(peak), computed according to equation [4] above in conjunction with the previously described measurement process, indicates the RMS value of Vin rather than a minimum or maximum peak value. The low pass filter 112 of FIG. 9 produces an output signal of magnitude equal to the DC level of Vtrig, and when this output signal is provided as the Vtrig' input to comparator 116, the computed value of Vin(peak) of equation [4] represents the DC level of Vin rather than its maximum or minimum peak level.

Thus oscilloscope 10 is adapted to measure input signal peaks, DC levels, and RMS values and to display magnitude data on the oscilloscope screen indicating the measured voltage as well as to display the cursor at a level which indicates the measured voltage in relation to voltages on a displayed waveform rather than in relation to nominal voltages represented by grid divisions. In addition, knob 35 permits an operator to adjust the cursor level data to position the cursor to intersect a displayed waveform at a selected point so that by reading the magnitude data, the operator can quickly and accurately ascertain the magnitude of the input signal corresponding to the selected waveform point, despite offset and gain errors in the vertical preamplifier system.

It should be understood that the cursor 36 of FIG. 2 may be displayed in forms other than as a horizontal line across the oscilloscope screen, such as, for example, in the form of a short arrow pointing to a vertical position on the screen, by appropriately choosing characters to be displayed. It should also be noted that the function of readout control circuit 44 could be performed by other means for indicating a position along the vertical axis of the screen in response to input data controlling the indicated position.

Thus while a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

We claim:

1. For an oscilloscope having means for amplifying an input signal to produce an output signal, having means responsive to said output signal for displaying a waveform on a screen wherein points on said waveform are displayed at positions along an axis of said screen representing magnitudes of said input signal, and having indicating means for indicating a position along said axis according to the value of position data, a method for determining a particular position data value which would cause said indicating means to indicate a position along said axis representing a particular magnitude, the method comprising the steps of:

determining a change in value of position data which would cause said indicating means to shift the position it indicates from a first to a second position along said axis, said first and second positions representing different known magnitudes of said input signal;

determining one value of said position data which would cause said indicating means to indicate a position along said axis representing a predetermined magnitude of said input signal; and determining said particular position data value according to a combination of the particular magnitude to be represented, the determined change in value of position data, and the determined one value of position data.

2. For an oscilloscope having means for amplifying an input signal to produce an output signal, having means responsive to said output signal for displaying a waveform on a screen wherein points on said waveform are displayed at positions along an axis of said screen representing magnitudes of said input signal, and having indicating means for indicating a position along said axis according to the value of position data, a method for determining a magnitude represented by a particular position along said axis indicated by said indicating means, the method comprising the steps of:

determining a change in value of position data which would cause said indicating means to shift the position it indicates from a first to a second position along said axis, said first and second positions representing different known magnitudes of said first input signal;

determining one value of said position data which would cause said indicating means to indicate a position along said axis representing a predetermined magnitude of said input signal; and determining the magnitude represented by said particular position along said axis according to a combination of the value of position data which caused said indicating means to indicate said particular position, the determined change in value of position data, and the determined one value of input data.

3. For an oscilloscope having amplifying means for producing a trigger source signal and means for generating a trigger level signal of magnitude set according the value of input trigger level data, a method for characterizing an input signal magnitude, the method comprising the steps of:

applying a first reference signal of known first magnitude as input to said amplifying means;

determining a first trigger level data value which sets said trigger level signal magnitude substantially equal to said trigger source signal produced by said amplifying means in response to said first reference signal;

applying a second reference signal of known second magnitude, differing from said first magnitude, as input to said amplifying means;

determining a second trigger level data value which sets said trigger level signal magnitude substantially equal to said trigger source signal produced by said amplifying means in response to said second reference signal;

applying said input signal as input to said amplifier means; and determining a third trigger level data value which sets said trigger level signal magnitude substantially equal to said trigger source signal produced by said amplifying means in response to said input signal.

4. The method according to claim 3 further comprising the step of characterizing said input signal magnitude according to a combination of said first, second and third trigger level data values.

5. The method according to claim 3 further comprising the step of characterizing said input signal magnitude according to a combination of said first, second and third trigger level data values and said first and second magnitudes.

6. The method according to claim 3 wherein the step of determining a third trigger level data value comprises the steps of:

successively adjusting said trigger level data; and
comparing said trigger source and trigger level signals to determine whether one of said trigger source and trigger level signals exceeds the other of said trigger source and trigger level signals between successive adjustments of said trigger level data to determine whether said trigger level data is to be increased or decreased when adjusted.

7. The method according to claim 6 wherein said trigger level data is successively adjusted by progressively smaller amounts.

8. For an oscilloscope having amplifying means for producing an output signal and a trigger source signal, having means responsive to said output signal for displaying a waveform on a screen wherein points on said waveform are displayed at positions along an axis of said screen representing magnitudes of a signal amplified by said amplifying means, having indicating means for indicating a position along said axis according to the value of position data, and having means for generating a trigger level signal of magnitude set according to the value of trigger level data, the method for representing a magnitude of an input signal comprising the steps of:
applying a first reference signal of known first magnitude as input to said amplifying means;
determining a first trigger level data value which sets said trigger level signal magnitude substantially equal to said trigger source signal produced by said amplifying means in response to said first reference signal;
applying a second reference signal of known second magnitude, differing from said first magnitude, as input to said amplifying means;
determining a second trigger level data value which sets said trigger level signal magnitude substantially equal to said trigger source signal produced by said amplifying means in response to said second reference signal;
applying said input signal as input to said amplifying means;
determining a third trigger level data value which sets said trigger level signal magnitude substantially equal to said trigger source signal produced by said amplifying means in response to said input signal;
determining the magnitude of said input signal according to a combination of said first, second and third trigger level data values and said first and second magnitudes; and
adjusting the value of said position data according to the determined magnitude of said input signal such that said indicating means indicates a position along said axis representing the determined magnitude of said input signal.

9. For an oscilloscope having amplifying means for producing an output signal and a trigger source signal, having means responsive to said output signal for displaying a waveform on a screen wherein points on said waveform are displayed at positions along an axis of said screen representing magnitudes of a signal amplified by said amplifying means, having indicating means for indicating a position along said axis according to the value of position data, and having means for generating a trigger level signal of magnitude set according to the value of trigger level data, the method for representing a magnitude of an input signal comprising the steps of:
determining said input signal magnitude;
determining a change in value of position data which would cause said indicating means to shift its position indication between two positions along said axis representing two different magnitudes;
determining one value of said position data which would cause said indicating means to indicate a position along said axis representing a predetermined magnitude; and
adjusting the value of said position data according to a combination of the determined magnitude of said input signal, the determined change in value of said position data, and the determined one value of said position data, such that said indicating means indicates a position along said axis representing said determined magnitude of said input signal.

10. In an oscilloscope having a screen for displaying a waveform, a cursor, and magnitude data, having means for generating first and second reference signals of differing magnitudes, having an amplifier for producing an output signal, having readout control means for generating a cursor control signal of magnitude determined by position data applied as input to the readout control means, and for controlling a value indicated by the displayed magnitude data wherein a relationship between values of the position data and the values magnitude data is adjustable in accordance with control data applied as input to the readout control means, having a summing means for producing a display control signal of magnitude proportional to a sum of signals applied to its input, the display control signal controlling display of the waveform when only the amplifier output signal is applied as input to the summing means and controlling display of the cursor when only the cursor control signal is supplied as input to the summing means, having switching means for selectively applying one of an input signal, the first reference signal and the second reference signal as input to the amplifying means and for selectively applying the amplifier output signal and the cursor control signal as inputs to the summing amplifier in response to a selection control signal, having comparator means responsive to the display control signal for producing an indicating signal indicating when the display control signal is of magnitude greater than a predetermined level, and having data processing means responsive to the indicating signal for producing the selection control signal, the position data, and the control data, a method for execution by the data processing means for causing the oscilloscope to measure and display an indication of a magnitude of the input signal, the method comprising the steps of:
producing the selection control signal of state such that the switching means applies the first reference signal as input to the amplifier, and applies both the amplifier output signal and the cursor control signal as inputs to the summing amplifier;
iteratively adjusting the position data while monitoring the indicating signal to determine a first magnitude of the position data causing the trigger level signal generator to produce a trigger level signal substantially equal in magnitude to the display control signal;
producing the selection control signal of state such that the switching means applies the second reference signal as input to the amplifier, and applies both the amplifier output signal and the cursor control signal as inputs to the summing amplifier;
iteratively adjusting the position data while monitoring the indicating signal to determine a second magnitude of the position data causing the trigger level signal generator to produce a trigger level signal substantially equal in magnitude to the display control signal;

producing the selection control signal of state such that the switching means applies the input signal as input to the amplifier, and such that the switching means applies the amplifier output signal and the cursor control signal to the summing amplifier in an alternating fashion such that the display control signal causes both the cursor and the waveform to be displayed on the screen, and such that positioning of the cursor on the screen is controlled by the magnitude of the position data signal and positioning of points of the waveform on the screen is controlled by instantaneous magnitudes of the input signal; and adjusting the control data applied to the readout control means in accordance with a combination of the determined first and second magnitudes and the magnitudes of the first and second reference signals such that for each of a set of values of the position data applied to said readout control means, the readout control means controls the value of the magnitude data displayed on said screen so that it indicates a magnitude of the input signal represented by a position of a point on said waveform on said screen corresponding to a position of the cursor on the screen.

* * * * *